(12) United States Patent
Nakazato et al.

(10) Patent No.: US 7,525,191 B2
(45) Date of Patent: Apr. 28, 2009

(54) SEMICONDUCTOR LIGHT SOURCE DEVICE

(75) Inventors: Norio Nakazato, Inzai (JP); Kimihiko Sudo, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/399,607

(22) Filed: Apr. 7, 2006

(65) Prior Publication Data
US 2006/0261351 A1    Nov. 23, 2006

(30) Foreign Application Priority Data
Apr. 8, 2005    (JP) .............................. 2005-111794

(51) Int. Cl.
*H01L 23/34* (2006.01)
*H01L 31/0232* (2006.01)

(52) U.S. Cl. .................... 257/713; 257/706; 257/88; 257/432; 257/E23.082

(58) Field of Classification Search ............. 257/88, 257/722, E33.075, 713, 706, 432, E23.082; 136/302
See application file for complete search history.

(56) References Cited

U.S. PATENT DOCUMENTS

| | | | | |
|---|---|---|---|---|
| 4,008,485 A * | 2/1977 | Miyoshi et al. | ............. | 257/101 |
| 5,724,818 A * | 3/1998 | Iwata et al. | ................... | 62/3.7 |
| 6,614,109 B2 * | 9/2003 | Cordes et al. | ............... | 257/712 |
| 6,781,832 B2 * | 8/2004 | Nakamura et al. | .......... | 361/695 |
| 6,791,181 B2 * | 9/2004 | Horie et al. | ................ | 257/706 |
| 6,855,880 B2 * | 2/2005 | Feher | .......................... | 136/203 |
| 6,893,902 B2 * | 5/2005 | Cordes et al. | ............... | 438/122 |
| 6,998,777 B2 * | 2/2006 | Suehiro et al. | .............. | 313/512 |
| 7,250,327 B2 * | 7/2007 | Sakamoto | .................... | 438/106 |
| 7,301,233 B2 * | 11/2007 | Lee et al. | .................... | 257/719 |
| 2003/0122245 A1 * | 7/2003 | Chu et al. | ................... | 257/706 |
| 2005/0024868 A1 * | 2/2005 | Nagai et al. | ................. | 362/227 |
| 2005/0146060 A1 * | 7/2005 | Suzuki | ........................ | 257/930 |
| 2005/0161682 A1 * | 7/2005 | Mazzochette et al. | ......... | 257/79 |
| 2005/0258438 A1 * | 11/2005 | Arik et al. | ..................... | 257/88 |
| 2005/0274959 A1 * | 12/2005 | Kim et al. | ..................... | 257/79 |

FOREIGN PATENT DOCUMENTS

| | | |
|---|---|---|
| JP | 2003-8083 A | 1/2003 |
| JP | 2004-342557 A | 12/2004 |
| WO | WO 2004/070852 A3 | 8/2004 |

OTHER PUBLICATIONS

Chinese Office Action, 7 pages, Aug. 30, 2007.

* cited by examiner

*Primary Examiner*—Nitin Parekh
(74) *Attorney, Agent, or Firm*—McDermott Will & Emery LLP

(57) ABSTRACT

A semiconductor light source device, for enabling to cool LED elements driven with short pulses, effectively, and also being cheaply producible without increasing the number of pats thereof, comprising a plural number of light emitting diode chips 202 on a heat diffusion plate 201, and Peltier elements 208, as being thermoelectric cooling elements, for cooling the plural number of light emitting diode chips 202, wherein a pair of members 208(*n*) and 2008(*p*), building up the Peltier element for cooling each the light emitting diode chip, are electrically connected on each of the light emitting diode chip through bumps 207, so as to form said light emitting diode chip and the Peltier element as a unit on the heat diffusion plate, respectively, and thereby moving heat generation within each of the light emitting diode chips, directly, into the heat diffusion plate and/or a heat radiation plate.

16 Claims, 6 Drawing Sheets

SEMICONDUCTOR LIGHT SOURCE DEVICE

BACKGROUND OF THE INVENTION

The present invention relates to a semiconductor luminance or light source device, being built by disposing a plural number of light emitting diodes on a heat or thermal diffusion plate. Specifically, the present invention relates to a cooling structure of such the semiconductor light source device.

In recent years, since the light emitting diodes, as one of the semiconductor elements, are able to emit therefrom the lights of the three primary colors, such as, red (R), green (G) and blue (B), for example, and therefore, they attract attentions of being applied to be a color display, for example, and also to be a light source device, enabling to emit a white color light from those light components of red (R), green (G) and blue (B). Further, in the following Patent Document 1, there is already known a semiconductor LED assembly, which mounts a large number of chips of the light emitting diodes, as being semiconductor elements, on a sub-mount thereof, to be shared with.

However, the light emitting diode (LED), as being semiconductor element, has high heat-dependency. Thus, the LED has a characteristic of lowering efficiency of converting from electric power into lights, when increasing temperature thereof. For this reason, as was known from the following Patent Document 2, for example, a technology was already proposed and also studied, of cooling down such the LED, being high in the heat dependency, with applying a Peltier element, i.e., a semiconductor thermoelectric cooling element, therein.

Patent Document 1: Japanese Patent Laying-Open No. 2003-008083 (2003); and

Patent Document 2: Japanese Patent Laying-Open No. 2004-342557 (2004).

By the way, normally, control is made on a brightness level of the light emitting diode (LED) through controlling the ON/OFF timing thereof; i.e., pulse (short pulse) operation (or driving) is adopted, in general. For this reason, for such the LED element, it is also necessary to make the cooling thereon, responding to the said drive pulse.

However, in particular, within the cooling structures for the LED chip building up a lightening unit, with applying the Peltier element therein, as is disclosed in the Patent Document 2 mentioned above, the said Peltier element is disposed, to be sandwiched or put between an upper substrate, on which the LEDs are mounted, and a lower substrate, in the structures thereof. However, in the structures disclosed therein, a light source array connecting a large number of LED chips in series and a Peltier module connecting also a large number of Peltier elements in series are connected in series, electrically, and for this reason there brings about a drawback that it is large in the time constant thereof.

For such the reason, in particular, with the cooling structures for the LED chips, which is disclosed in the Patent Document 2, a problem is pointed out that it is not necessarily sufficient to be the cooling structure, in particular, for cooling the LED elements, which are driven with the short pulses, effectively. Also, within the light source device mounting the large number of LED chips and the Peltier elements therein, it is demanded to reduce the number of the parts much more, and to reduce the cost thereof, as well.

BRIEF SUMMARY OF THE INVENTION

The, according to the present invention, being accomplished by taking the drawbacks of the conventional arts mentioned above into the consideration thereof, an object thereof is provide a semiconductor light source device, in particular, being also able to cool down the LED elements, which are driven with the short pulses, with high efficiency, and producible in cheap, without greatly increasing the number of parts thereof.

For accomplishing the object mentioned above, according to the present invention, first of all there is provided a semiconductor light source device, comprising: a heat diffusion plate; a plural number light emitting diode chips, being disposed on said heat diffusion plate; and thermoelectric cooling elements for cooling said plural number light emitting diode chips, wherein portions of a pair of thermoelectric members, building up said thermoelectric element for cooling each of said plural number light emitting diode chips, are electrically connected, through a portion of each of said plural number light emitting diode chips, and thereby forming said light emitting diode chips and said thermoelectric elements as a unit, respectively, on said heat diffusion plate.

Also, according to the present invention, within the semiconductor light source device as described in the above, it is preferable that on said heat diffusion plate are formed circuit patterns for mounting said plural number light emitting diode chips, and the thermoelectric members building up said thermoelectric element are mounted on a portion of the circuit patterns formed on said heat diffusion plate, thereby building up said light emitting diode chips and said thermoelectric elements into one body.

Also, according to the present invention, within the semiconductor light source device as described in the above, it is preferable that a portion of said light emitting diode chips includes a chip having such structure of electrodes of a face-mounting type, that an electrode is attached on one surface thereof, and in the case that connection is made between an electrode surface of said light emitting diode chip, which has the electrode structure of said face-mounting type, and a surface of the thermoelectric members for building up said thermoelectric cooling elements, through a bonding pad.

Further, according to the present invention, within the semiconductor light source device as described in the above, a portion of said light emitting diode chips includes a chip having such structure of electrodes that electrodes are attached onto both surfaces thereof, and in the case that one of the electrodes attached on the both surfaces of said light emitting diode chip is connected on a surface of one of said pair of thermoelectric members, while mounting other of said thermoelectric members on a part of said circuit patterns, and a surface of said other thermoelectric member is connected onto other electrode of said light emitting diode chip through wire bonding.

In addition thereto, according to the present invention, it is preferable that the semiconductor light source device as described in the above, further comprises a heat radiation plate, which is attached on a lower surface of said heat diffusion plate.

According to the present invention mentioned above, as is also apparent from the detailed explanation, which will be given below, it is possible to move the heat generation within each of the high emitting diode chips building up the semiconductor light source device, directly, through functions of the thermoelectric elements provided for each thereof, respectively, into the heat diffusion plate and/or the heat radiation plate, swiftly, which are provided below, and thereby providing the semiconductor light source device, which can also cool down the light emitting diodes with the short pulses, effectively. In addition thereto, it enables to manufacture it, cheaply without greatly increasing the number of parts thereof.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE INVENTION

Hereinafter, embodiments according to the present invention will be fully explained by referring to the attached drawings.

Figure 1:
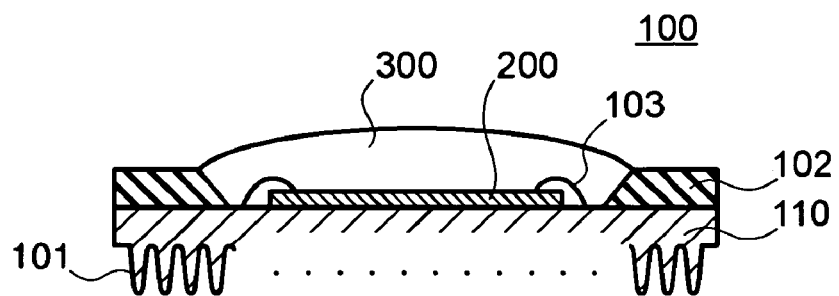
FIG. 1 is a side cross-section view for showing the entire structures of a light source device, according to an embodiment of the present invention.

First of all, FIG. 1 shows the side cross-section view of a light source device 100, having a large number of chips of light emitting diodes disposed on a thermal or heat diffusion plate, according to an embodiment of the present invention. Thus, with this light source device, on a heat radiation plate 110 made of a material, being superior in the thermal conductivity, such as, copper or aluminum, etc., for example, on the reverse surface thereof (i.e., the lower side surface in the figure) of which are formed a large number of heat-radiation fins 101, there is mounted so-called an LED light source module 200, i.e., being built up with mounting a large number of chips of semiconductor light emitting diodes (LEDs) on the surface of the heat diffusion plate, which is made of a silicon substrate, for example. However normally, a frame 102 made of a resin is attached on a periphery of the heat radiation plate 110, which is made of aluminum, for example, through an adhesive or the like, and the LED light source module 200 is mounted on the surface of the heat radiation plate 110. And, after completing electrical connection through wire bonding 103 with using an Au wire, for example, further a transparent resin layer 300 is formed through filling up a transparent resin, for example, within an inside of the frame 102, and thereby completing the light source device 100.

Figure 2:
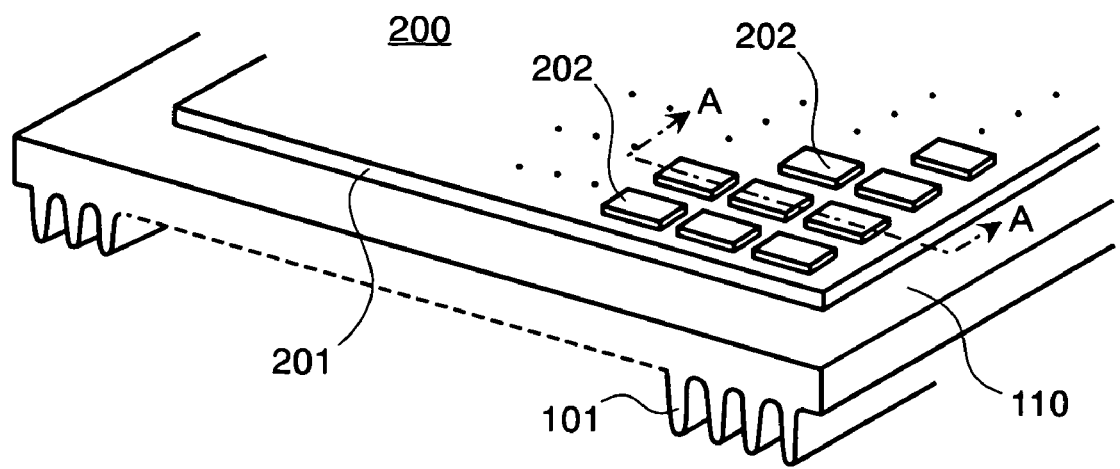
FIG. 2 is a partial enlarged perspective view of an LED light source module of the light source device, for showing a part of the surface thereof.

Next, FIG. 2 attached herewith shows a part of the surface of the light source device 100 (but, before forming the transparent resin layer 300 thereon), enlargedly. Thus, in the figure, it is apparent that the LED light source module 200 mentioned above is attached on the surface of the heat radiation plate 110, which is formed with the large number of heat radiation fins on the reverse surface thereof, through an adhesive or a bonding material, mixing metal fillers or the like therein or being superior in the thermal conductivity thereof, and that a large number of semiconductor LED chips 202 and 202 are mounted on the surface of the heat diffusion plate 201 made of silicon substrate, which builds up that module. Further, A-A cross-section in this FIG. 2 is shown in FIG. 3 attached.

Figure 3:
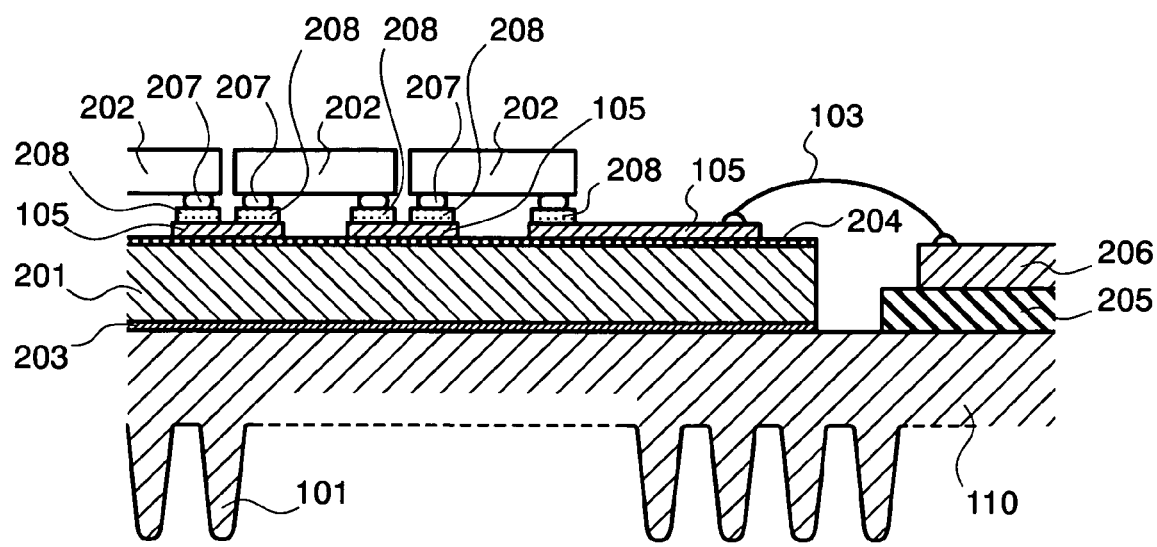
FIG. 3 is also a partial enlarged perspective view of the LED light source module shown in FIG. 1 mentioned above, in particular, for showing a A-A cross-section thereof.

As is apparent from this FIG. 3, the heat diffusion plate 201 of silicon is fixed on the surface of the heat radiation plate 110 of aluminum, which is formed with the large number of heat radiating fins on the reverse surface thereof, through the adhesive 203 ob being superior in the thermal conductivity thereof, as was mentioned above, and on the surface of this heat diffusion plate 201 is formed an insulation layer 204 of silicon oxide, which is formed within an oxidizing atmosphere. And, on the surface of the insulation layer are formed predetermined wiring patterns 105 through evaporation process of metal, for example. However, the reference numeral 205 in this figure depicts the insulation layer, which is formed on the heat radiation plate 110 of aluminum, and further on the surface thereof is also formed a predetermined wiring pattern 206, also through the evaporation process of metal, for example. And, this wiring pattern 206 is electrically connected with a wiring pattern 105 of the LED light source module 200, on the heat diffusion plate 201, through the wire bonding 103, appropriately. Also, this wiring pattern 206 is made up with a layer of metal, such as, Ag or Au/Cu, for example.

Figure 4:
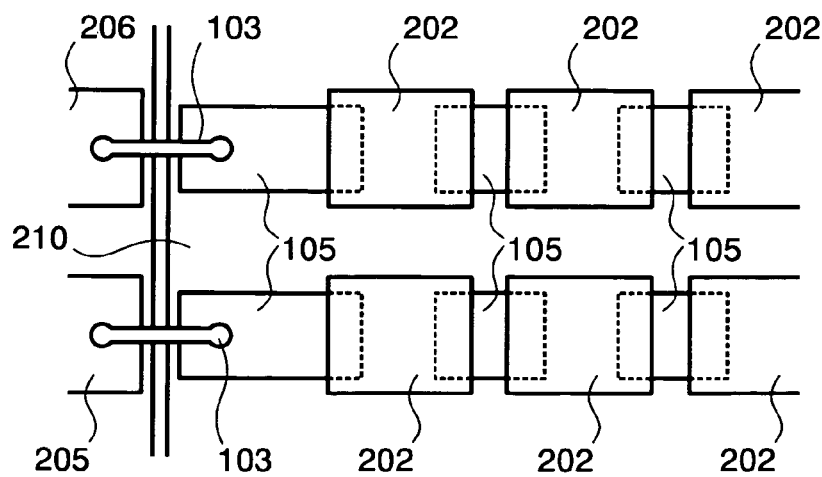
FIG. 4 is a partial enlarged upper view for showing wiring patterns on the surface of a heat diffusion plate, which builds up the LED light source module mentioned above.

Further, an upper view of those wiring patterns 105 and 206 is shown in FIG. 4 attached herewith. However, as is apparent from this figure, on the wiring patterns 105 formed on the heat diffusion plate 201 are mounded the large number of the above-mentioned semiconductor LED chips 202 and 202, respectively (but, covering over a pair of wiring patterns 105 and 105 neighboring to each other, in the present example).

Hereon, turning back to FIG. 3, again, on the wiring patterns 105 and 105 are mounted members 208 for building up the Peltier element, i.e., the thermoelectric cooling element, in more details thereof, a chip of "p" type bismuth telluride and a chip of "n" type bismuth telluride are mounted, alternately, through bumps 207 of Au or soldering, etc., for example. And, bridging over those constituent members 208 of the Peltier elements (in more details, the chip of "p" type bismuth telluride and the chip of "n" type bismuth telluride), which are mounted alternately, the semiconductor LED chips 202 mentioned above are mounted, respectively. However, within the Pultier element, antimony telluride may be applied, in the place of the chip of "p" type bismuth telluride, as the "p" type chip thereof.

Figure 5:
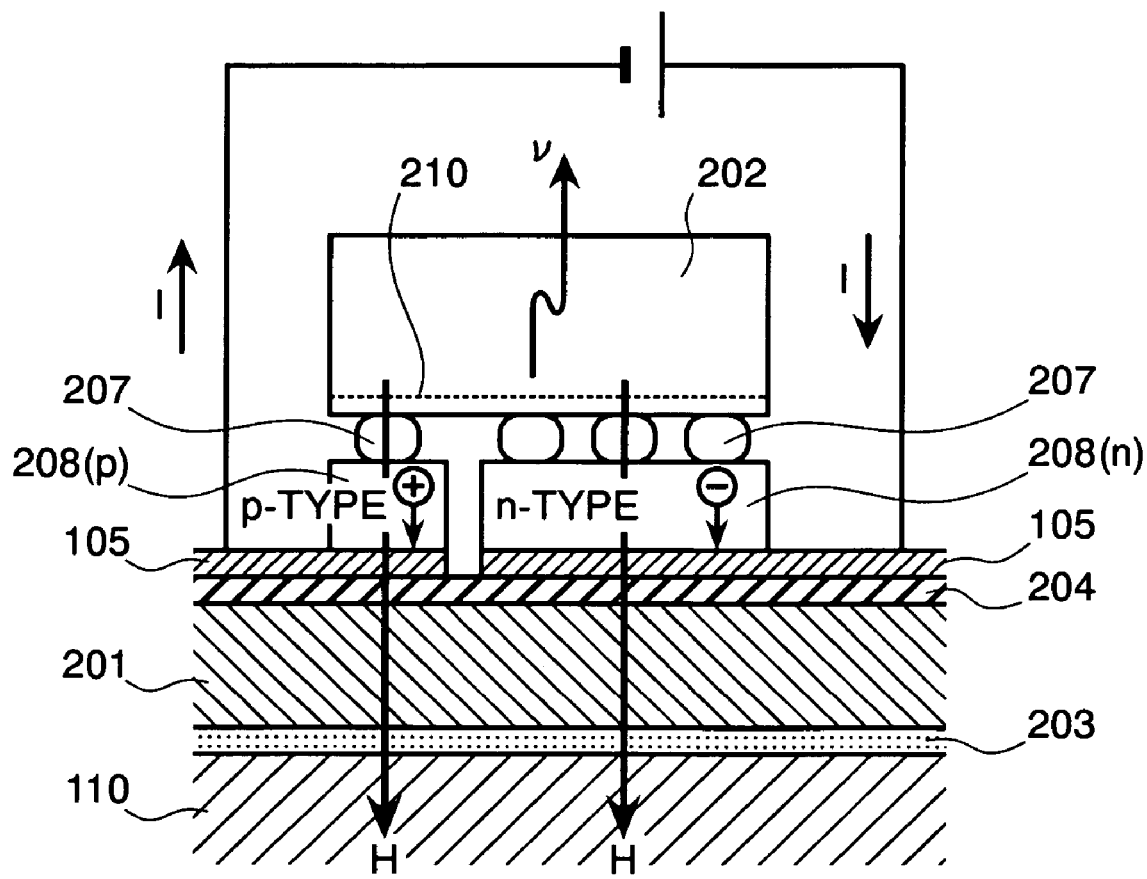
FIG. 5 is a partial enlarged cross-section view for explaining the condition of connecting the semiconductor LED chips of the LED light source module, and the operation thereof.

Namely, as was mentioned above, on the LED light source module 200 building up the light source device 100, the large number of the semiconductor LED chips 202 and 202 are connected, directly on the members 208, building up the Peltier elements, as to be the thermoelectric cooling element. An enlarged view of showing this condition is shown in FIG. 5 attached herewith. As is apparent from this figure, pair of the members 208 and 208, which build up the Peltier element (i.e., one of them is the chip of "p" type bismuth telluride, while the other is the chip of "n" type bismuth telluride) are connected with the semiconductor LED chip 202 through the bumps 207; thus, building up p-n junction of the Peltier element, including the semiconductor LED chip 202 therein.

Figure 6:
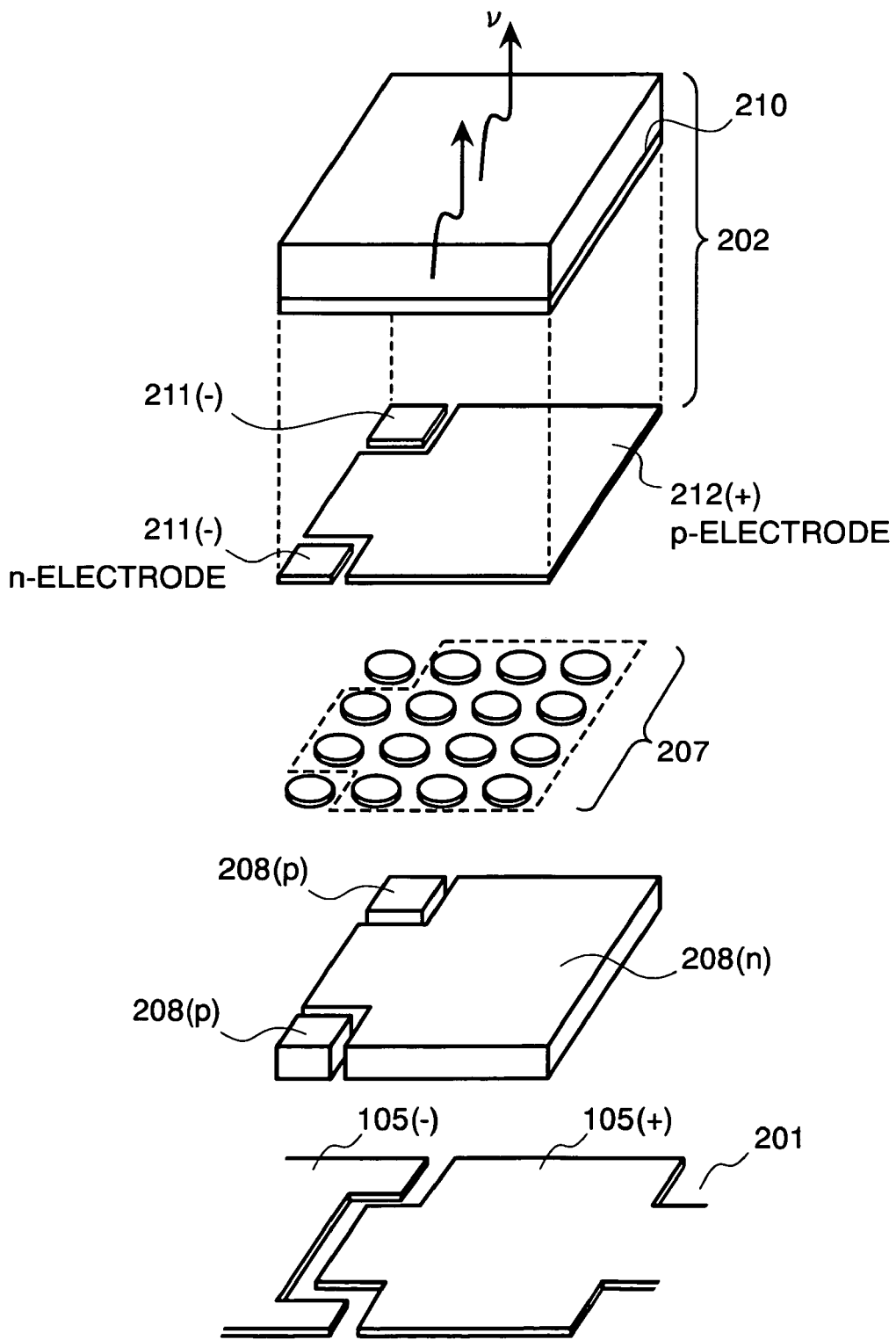
FIG. 6 is an exploded perspective view for showing the details of the structures of connecting the semiconductor LED chips and Peltier elements.

However, further details of the connecting structures between the semiconductor LED chip 202 and the pair of the members 208 and 208, which build up the Peltier element (i.e., one of them is the chip of "p" type bismuth telluride, while the other is the chip of "n" type bismuth telluride) are shown in FIG. 6 attached herewith. Further, also in this FIG. 6, the same reference numerals in FIG. 5 mentioned above depict the same or similar elements.

As is apparent from this FIG. 6, the LED chip 202 of face-mounting type (i.e., an element being provided an electrode for mounting on one side of the surfaces thereof), according to the present example, has a p-n junction surface 210 in the vicinity of a lower surface thereof, and it generates lights from this junction surface into the direction shown by arrows in the figure. However, this LED chip 202 of the face-mounting type has a pair of electrodes 211 of "n" type (i.e., minus (−)) and an electrode 212 of "p" type (i.e., plus (+)) covering over a bottom surface thereof, as is shown by reference numerals. And, disposing the bonding pads 207 in plural number thereof, corresponding (or opposing) to those electrodes 211 and 212, this is electrically connected on the Peltier element, as being thermoelectric cooling element, thereby being mounted thereon. In more details thereof, corresponding to the electrodes 211 and 212 of the LED chip 202, respectively, there are provided the chip 208(*p*) of "p" type bismuth telluride and the chip of 208(*n*) of "n" type bismuth telluride, which build up the Peltier element. However, below those the chip 208(*p*) of "p" type bismuth telluride and the chip of 208(*n*) of "n" type bismuth telluride are positioned the wiring patterns 105, respectively, which are formed on the surface of the heat diffusion plate 201.

Again, turning back to FIG. 5 mentioned above, when supplying a driving electric power (or, pulse current) is supplied to the LED chip 202, which is connected, directly, on the members 208 building up the Peltier element, i.e., thermoelectric cooling element, as was mentioned above, then current flows into a direction of an arrow "I" in the figure. As a result thereof, lights are generated from the p-n junction of the LED chip 202 (see an arrow "y" in the figure), and at the same time, heat is generated therein. However, in this instance, since the current flows from the chip 208(*n*) of "n" type bismuth telluride into the chip 208(*p*) of "p" type bismuth telluride through the LED chip 202, electrons and protons within an inside thereof move into the direction shown in the figure, and thereby guiding the heat generated in the LED chip 202 into the direction of an arrow "H" shown in the figure. Thus, the heat generated in each of the LED chips 202, while generating the light in the operation thereof at the same time, is moved into the heat diffusion plate 201, and further into the direction of the heat radiation plate 110, which forms the large number of heat radiation fins on the reverse surface thereof, and thereby enabling effective cooling of the LED chip 202.

In other words, with such the cooling structures as was mentioned above, since each of the LED chips 202 is electrically connected with the Peltier element, which is provided in the lower portion thereof, then the driving current flowing within the said LED chip comes into electrons or protons for the heat transfer within the Peltier element just below that, and thereby moving the heat generation of the LED chip below, swiftly. Further, this means that, in particular, when driving the LED chip with the pulses, each having relatively short width, it is possible to reduce the time constant for cooling the element (i.e., a cooling response time), greatly, being necessary for responding to such the short pulses. Further, in more details thereof, with such the cooling structures as was mentioned above, it is possible to increase the maximum rated value of the driving current up to two (2) times larger, approximately.

In this manner, within the LED light source module 200, which is mounted on the heat radiation plate 110 building up the light source device 100, while mounting the large number of the LED chips 202 on the surface thereof, as was mentioned above, it is possible to achieve cooling, effectively, for each of the LED chips 202, through the Peltier elements 208(*p*) and 208(*n*), which are directly connected onto the lower surface thereof, and for this reason, it is also possible to increase a density of mounting the LED chips 202 on the surface of the LED light source module 200, and/or thereby achieving high-brightness of the LED chips 202.

Also, with the structures of the LED chip 202; i.e., unifying it with the Peltier element, being the thermoelectric cooling element, as a unit, it is possible to complete the connections of the chip 208(*n*) of "n" type bismuth telluride and the chip 208(*p*) of "p" type bismuth telluride, building up the said Peltier element, only by mounting the LED chip 202 on the bonding pads 207, but being necessary for mounting the LED chip 202 thereon, inherently. This means, namely, there is no necessity of the members, which are essentially needed for obtaining the electric connection between the members for building up the Peltier element, and it is very advantageous for simplifying manufacturing processes and/or for achieving a low price of the device.

Figure 7:
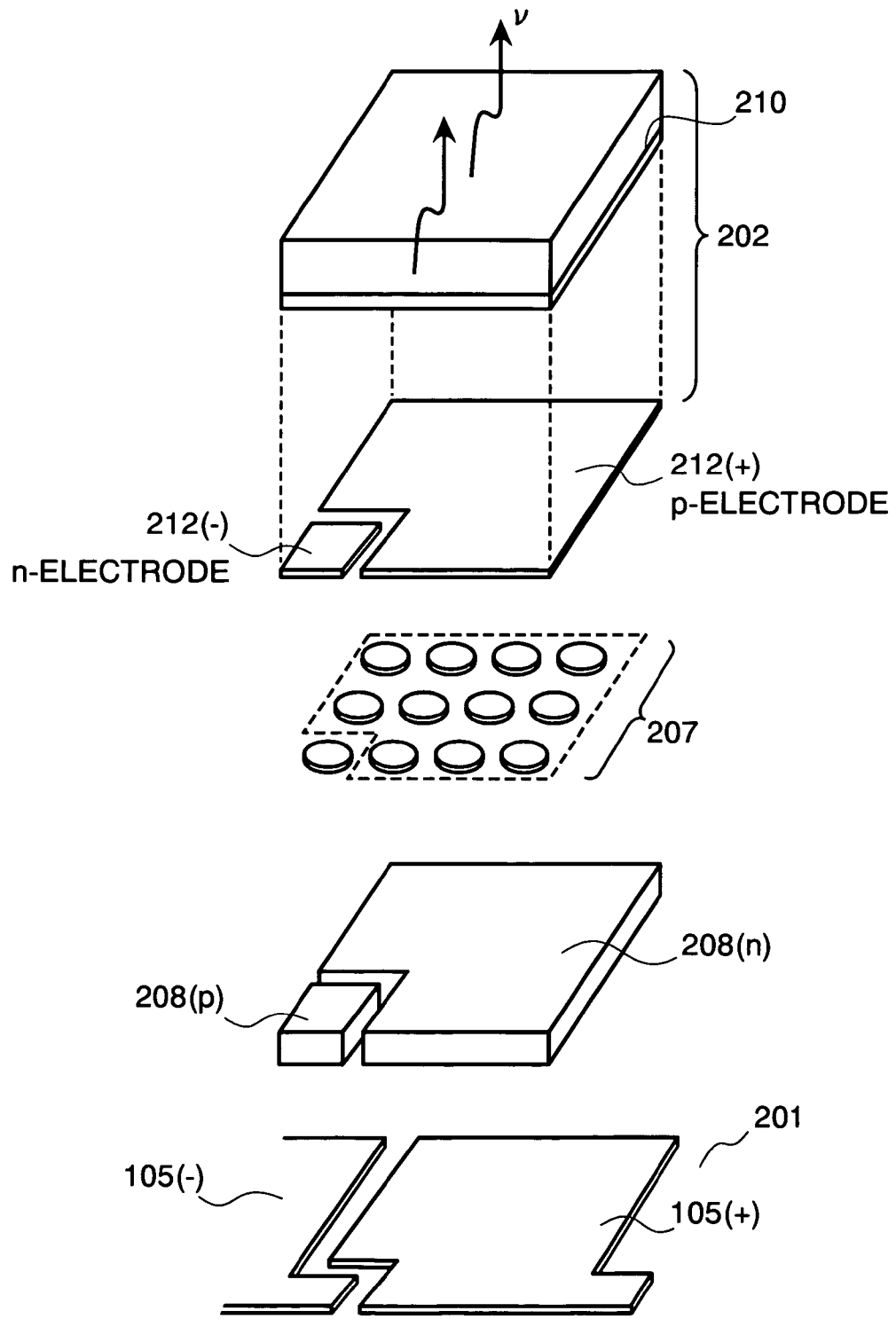
FIG. 7 is also an exploded perspective view for showing the details of the structures of connecting the semiconductor LED chips and Peltier elements, but differing from that shown in FIG. 7.

Next, FIG. 7 attached herewith shows the details of the structures for connection, but differing from the terminal structures mentioned above, in particular, for connecting the LED chip 202, which has one (1) piece of the "n" type electrode 211(−) and one (1) piece of the "n" type electrode 212(+), almost covering over the bottom surface, on the bottom surface side thereof, onto the pair of members 208(*p*) and 208(*n*) building up the Peltier element. However, the reference numerals and/or marks same to those shown in FIG. 6 mentioned above also depict the same or similar elements thereof, in this FIG. 7, and it is apparent that the same or similar effects as were mentioned above can be obtained with such the structures, for a person skilled in the art.

However, in the embodiments mentioned above, although the explanation was made that the large number of wiring patterns 105 are formed on the surface of the heat diffusion plate 201, which is made from a silicon plate for building up the LED light source module 200, and also that on the surface thereof are mounded the chip 208(*n*) of "n" type bismuth telluride and the chip 208(*p*) of "p" type bismuth telluride, respectively; however according to the present invention, should not be restricted into such the structures, but for example, it is also possible to form layers of the chip 208(*n*) of "n" type bismuth telluride and the chip 208(*p*) of "p" type bismuth telluride, with applying an ordinary semiconductor manufacturing processes, after forming the wiring patterns 105 on the surface of the heat diffusion plate 201 (in more strict, on the insulation layer 204). However, with such the structures of building up the Peltier element with applying the semiconductor manufacturing processes therein, it is also advantageous, much more, for simplifying manufacturing processes and/or for achieving a low price of the device. Further, as was mentioned in the above, within the Peltier element, antimony telluride may be applied, in the place of the chip of "p" type bismuth telluride, as the "p" type chip thereof.

Figure 8:
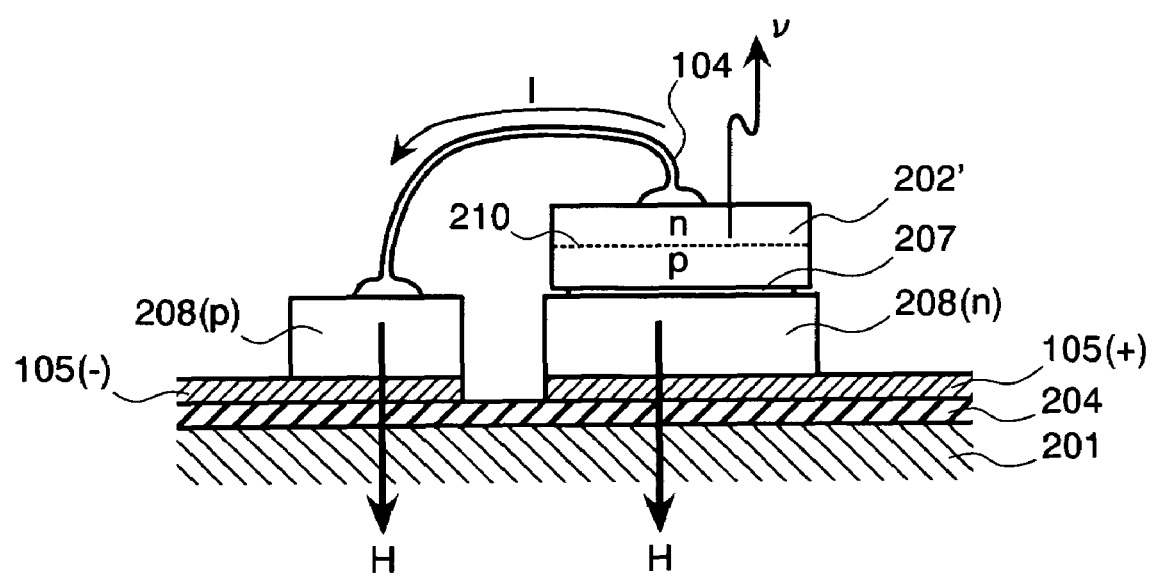
FIG. 8 is a partial enlarged cross-section view for explaining the condition of connecting the semiconductor LED chips of the light source device, according to other embodiment of the present invention.

Further, FIG. 8 attached herewith shows the structures, according to other embodiment of the present invention, applying a LED chip 202' having an ordinary p-n junction (i.e., having an "n" type electrode on the upper side of the chip and a "p" type electrode on the lower side thereof, respectively), but differing from that of applying the LED chip of face-mounting type explained in the above. In this case, as is also apparent from the figure, the LED chip 202' is connected, directly, mounting the "p" type electrode (+), which is attached on the lower surface thereof, onto the surface of the chip 208(*n*) of "n" type bismuth telluride for building up the Peltier element therewith, which is mounted on the positive wiring pattern 105(+) formed on the surface of the heat diffusion plate 201, through also the bonding pads 207, etc. On the other hand, neighboring thereto, the other member for building up the Peltier element therewith, i.e., the chip 208(*p*) of "p" type bismuth telluride is mounted on the negative wiring pattern 105(−), which is formed on the surface of the heat diffusion plate 201, and thereby achieving connection between the surface of the chip 208(*p*) of "p" type bismuth telluride and the "n" type electrode (−) on the surface of the LED chip 202' through the wire bonding 104.

Thus, with such the structures as was mentioned above, the pair of the members 208(*p*) and 208(*n*) for building up the Peltier element are connected with the semiconductor LED chip 202' through the wire bonding 104; i.e., building up the p-n junction of the Peltier element, including the semiconductor LED chip 202' therein. However, the electrodes of "p" type and "n" type of the LED chip 202' may be connected, appropriately, corresponding to the direction of current flowing therein, at that time.

Further, also with such the cooling structures according to the other embodiment as was mentioned above, the heat generated in each of the LED chips 202', while generating the light in the operation thereof at the same time, is moved into the direction of the heat diffusion plate 201 and the heat radiation plate 110 of aluminum, and thereby enabling effective cooling thereof, in the similar manner to that of the embodiments mentioned above. Also with this, it is needless to say, the time constant for cooling the element (i.e., a cooling response time) can be reduced, greatly, responding to the short pulses for driving thereof, and thereby increasing the maximum rated value of the driving current, remarkably, and further it is very advantageous for simplifying manufacturing processes and/or for achieving a low price of the device.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A semiconductor light source device, comprising:
   a heat diffusion plate;
   a plurality of light emitting diode chips arranged in an array, the light emitting diode chips disposed above said heat diffusion plate; and
   thermoelectric cooling elements for cooling the plurality of the light emitting diode chips, wherein portions of a pair of Peltier elements making up the thermoelectric element for cooling each of the plurality of the light emitting diode chips, are electrically connected in series, through a portion of each of the plurality of the light emitting diode chips, and thereby forming said light emitting diode chips and said thermoelectric elements as a unit electrically, respectively, on said heat diffusion plate;
   wherein the light emitting diode chip connected with the pair of Peltier elements on an electrode thereof drives a pulse current.

2. The semiconductor light source device, as described in the claim 1, wherein the heat diffusion plate has circuit patterns thereon for mounting the plural number light emitting diode chips, and the Peltier elements making up the thermoelectric element are mounted on a portion of the circuit patterns formed on said heat diffusion plate, thereby building up said light emitting diode chips and said thermoelectric elements into one body.

3. The semiconductor light source device, as described in the claim 1, wherein the light emitting diode chips have a structure of electrodes of a face-mounting type, wherein electrodes are provided on one surface of the light emitting diode chip.

4. The semiconductor light source device, as described in the claim 3, wherein bonding pads connect between an electrode surface of the light emitting diode chip and a surface of the thermoelectric member of the thermoelectric cooling elements.

5. The semiconductor light source device, as described in the claim 1, wherein the light emitting diode chips have a p-n junction and a structure of electrodes that have an n-type electrode on the one side of the chip and a p-type electrode on the other side of the chip.

6. The semiconductor light source device, as described in the claim 5, wherein the heat diffusion plate has circuit patterns thereon, the electrodes are provided on an upper side and a lower side of the light emitting diode chips respectively, the one electrode on the lower side of the light emitting diode chip connects to a surface of one of the pair of Peltier elements mounted on a part of the circuit patterns, and the other electrode on an upper side of the light emitting diode chip connects to a surface of the other of the pair of the Peltier elements mounted on another part of the circuit patterns through wire bonding.

7. The semiconductor light source device, as described in the claim 1, further comprises a heat radiation plate, which is attached on a surface of the heat diffusion plate, the surface of the heat diffusion plate is adjacent to a surface of the light emitting diode chips.

8. A semiconductor light source device, comprising:
   a heat diffusion plate having circuit patterns;
   a plurality of light emitting diode chips arranged in an array, the light emitting diode chips disposed above the heat diffusion plate and each of the light emitting diode chips has two electrodes; and
   thermoelectric cooling elements for cooling the plurality of the light emitting diode chips,
   wherein each thermoelectric cooling element has a pair of Peltier elements,
   wherein each pair of Peltier elements electrically connects in series, a pair of electrodes of one light emitting diode chip to a pair of circuit patterns of the heat diffusion plate, and
   wherein a single pulse current drives the one light emitting diode chip and drives the pair of Peltier elements.

9. The semiconductor light source device, as described in the claim 8, wherein the light emitting diode chip and the pair of thermoelectric elements are disposed as a unit, respectively, on said heat diffusion plate.

10. A semiconductor assembly for simultaneously driving a Peltier device and a semiconductor device, the semiconductor assembly comprising:

the Peltier device, wherein the Peltier device comprises at least one n-type Peltier element and one p-type Peltier element; and the semiconductor device, and wherein the n-type Peltier element, the semiconductor device, and the p-type Peltier element are electrically connected in series, wherein the semiconductor assembly is configured such that a driving current applied to the n-type Peltier element passes through the n-type Peltier element, passes through the semiconductor device, passes through the p-type Peltier element and wherein the semiconductor assembly comprises an array of light emitting diodes, and wherein each light emitting diode is electrically connected in series with at least one n-type Peltier element and at least one p-type Peltier element.

11. The semiconductor assembly of claim 10, wherein the semiconductor device is a light emitting diode.

12. The semiconductor assembly of claim 10, further comprising:
- a first gold or soldering located between the semiconductor device and the n-type Peltier element;
- a second gold or soldering located between the semiconductor device and the p-type Peltier element, wherein the first gold or soldering is not in direct electrical contact with the second gold or soldering;
- a wiring pattern located beneath the Peltier device for conducting the driving current;
- an electrically insulating layer located below the wiring pattern;
- a heat diffusion plate located below the electrically insulating layer;
- an adhesive layer below and contacting the heat diffusion plate;
- a heat radiation plate below and contacting the adhesive layer; and
- fins protruding from the heat radiation plate.

13. The semiconductor assembly of claim 10, wherein the p-type Peltier element is configured to correspond with a negative electrode of the semiconductor device, and wherein the n-type Peltier element is configured to correspond with a positive electrode of the semiconductor device.

14. The semiconductor assembly of claim 13, wherein the p-type Peltier element is separated into at least a first sub-element and a second sub-element, wherein the first sub-element is configured to correspond with a similarly shaped first sub-portion of the negative electrode, and wherein the second sub-element is configured to correspond with a similarly shaped second sub-portion of the negative electrode.

15. The semiconductor assembly of claim 10, wherein the semiconductor assembly is configured such that the driving current enters a first surface of the semiconductor device, passes through the semiconductor device, and exits a second surface of the semiconductor device, wherein the first surface and the second surface are located on opposite sides of the semiconductor device.

16. The semiconductor assembly of claim 15, further comprising:
- a heat diffusion plate;
- an electrical insulating layer;
- a first portion of wiring pattern;
- a second portion of wiring pattern; and
- wire bonding, wherein the electrical insulating layer is located above the heat diffusion plate, the first portion of wiring pattern is located above the electrical insulating layer, the second portion of wiring pattern is located above the electrical insulating layer, the n-type Peltier element is located above the first portion of wiring pattern, gold or soldering is located above the n-type Peltier element, the semiconductor device is located above the gold or soldering, a first end of a wire bond is attached to a top surface of the semiconductor device, a second end of the wire bond is attached to a top surface of the p-type Peltier element, the p-type Peltier element is located above the second portion of the wiring pattern, and the semiconductor device is configured such that a driving current passes through the first portion of the wiring pattern, then through the n-type Peltier element, then through the gold or solder, then through the semiconductor device, then through the wire bond, then through the p-type Peltier element and, then through the second portion of the wiring pattern.

* * * * *